United States Patent
Rotzoll et al.

(10) Patent No.: US 10,763,805 B2
(45) Date of Patent: Sep. 1, 2020

(54) PROGRAMMABLE POWER AMPLIFIER

(71) Applicant: EM Microelectronic-Marin S.A., Marin (CH)

(72) Inventors: Robert R. Rotzoll, Cascade, CO (US); Kevin Scott Buescher, Colorado Springs, CO (US)

(73) Assignee: EM Microelectronic-Marin S.A., Marin (CH)

( * ) Notice: Subject to any disclaimer, the term of this patent is extended or adjusted under 35 U.S.C. 154(b) by 0 days.

(21) Appl. No.: 16/144,207

(22) Filed: Sep. 27, 2018

(65) Prior Publication Data

US 2020/0106408 A1 Apr. 2, 2020

(51) Int. Cl.
*H03F 1/14* (2006.01)
*H03F 3/217* (2006.01)
(Continued)

(52) U.S. Cl.
CPC ............ *H03F 3/2175* (2013.01); *H03F 3/24* (2013.01); *H03F 3/72* (2013.01);
(Continued)

(58) Field of Classification Search
CPC . H03F 3/2175; H03F 3/72; H03F 3/24; H03F 2200/252; H03F 2203/7221;
(Continued)

(56) References Cited

U.S. PATENT DOCUMENTS

| 8,890,617 B2 * | 11/2014 | Marra | H03F 1/30 330/285 |
| 2005/0248405 A1 * | 11/2005 | Tsuchi | G09G 3/2011 330/257 |

(Continued)

FOREIGN PATENT DOCUMENTS

| EP | 2 251 976 A1 | 11/2010 |
| EP | 3 168 986 A1 | 5/2017 |
| KR | 20080090127 A | 10/2008 |

OTHER PUBLICATIONS

Extended Search Report dated Mar. 11, 2020 in Europe Patent Application No. 19194604.5-1203/3633853 (10 pgs.).

*Primary Examiner* — Khanh V Nguyen
(74) *Attorney, Agent, or Firm* — Oblon, McClelland, Maier & Neustadt, L.L.P.

(57) ABSTRACT

The present invention concerns a programmable power amplifier comprising:
an amplifier core transistor circuit connected to an amplifier output node; a switch connected to the amplifier core transistor circuit, the switch being configured to switch on and off the amplifier core transistor circuit; and a feedback circuit of the amplifier core transistor circuit. The feedback circuit comprises a digital-to-analog converter and an operational amplifier having a first input node configured to receive a first reference signal; a second input node connected to the digital-to-analog converter; and an output node for outputting an operational amplifier output signal and connected to the amplifier core transistor circuit for controlling the amount of current flowing in the amplifier core transistor circuit. The digital-to-analog converter has a programmable resistance value for controlling the resistance of the digital-to-analog converter to thereby adjust a digital-to-analog converter output signal fed to the second input node of the operational amplifier for controlling an amplifier output signal at the amplifier output node.

19 Claims, 2 Drawing Sheets

(51) Int. Cl.
  *H03F 3/24* (2006.01)
  *H03F 3/72* (2006.01)
(52) U.S. Cl.
  CPC .. *H03F 2200/252* (2013.01); *H03F 2200/451* (2013.01); *H03F 2203/7221* (2013.01)
(58) Field of Classification Search
  CPC .... H03F 2200/451; H03F 1/0277; H03F 1/34; H03F 1/36; H03F 3/45475; H03F 3/343; H03F 2200/294; H03G 1/0088
  USPC .......................................... 330/51, 85, 291
  See application file for complete search history.

(56) References Cited

U.S. PATENT DOCUMENTS

| | | |
|---|---|---|
| 2012/0205978 A1 | 8/2012 | Wong |
| 2013/0094606 A1 | 4/2013 | Lai et al. |
| 2013/0142283 A1 | 6/2013 | Hori |
| 2015/0139362 A1 | 5/2015 | Lee et al. |

* cited by examiner

PROGRAMMABLE POWER AMPLIFIER

TECHNICAL FIELD

The present invention relates to a programmable power amplifier. More specifically, the invention relates to a programmable precision power-controlled radio frequency (RF) amplifier. The invention also relates to a method of operating the proposed power amplifier.

BACKGROUND OF THE INVENTION

An RF power amplifier is a type of electronic amplifier that converts a low-power RF signal into a higher power signal. RF power amplifiers are typically used to drive the antenna of a transmitter. Product manufacturers often have a need to control output power from RF power amplifiers. This allows them to optimize performances such as transmission range and battery life and at the same time not to violate government regulations dealing with power emissions. For that purpose, power amplifiers known in the art are usually based on methods that control gate or base drive, adjust bias current or parallel devices together performing power control.

Nevertheless, existing power amplifier control techniques are sensitive to temperature, manufacturing process tolerances and power supply voltage variations. Furthermore, it is difficult to have a linear power control of the output power and to achieve output power steps of 0.5 dB or smaller.

SUMMARY OF THE INVENTION

An object of the present invention is to overcome at least some of the above shortcomings of existing power amplifiers. More specifically, the present invention aims to improve upon the ability to set the output power in a power amplifier with high precision and to maintain the power level across the operational temperature range.

According to a first aspect of the invention, there is provided a programmable power amplifier comprising:
  a power amplifier core transistor circuit connected to a power amplifier output node;
  a switch connected to the amplifier core transistor circuit, the switch being configured to switch on and off the amplifier core transistor circuit;
  a feedback circuit of the power amplifier core transistor circuit, the feedback circuit comprising a digital-to-analog converter and an operational amplifier having a first input node configured to receive a first reference signal; a second input node connected to the digital-to-analog converter; and an output node for outputting an operational amplifier output signal and connected to the amplifier core transistor circuit for controlling the amount of current flowing in the amplifier core transistor circuit,
  wherein the digital-to-analog converter has a programmable resistance value for controlling the resistance of the digital-to-analog converter to thereby adjust a digital-to-analog converter output signal configured to be fed to the second input node of the operational amplifier for controlling a power amplifier output signal at the power amplifier output node.

The proposed solution has the advantage that the proposed amplifier operates in a low current and voltage arena. Furthermore, the output power is highly accurate, and the programmable power output step size is less than 0.5 dB. Optionally, programmable waveform shaping may also be included to allow maximum flexibility in meeting governmental bandwidth requirements. Furthermore, by attaching the output of the power amplifier to an inductor that is also connected to a power supply and to an RF matching network, the current output from the amplifier generates a voltage across the inductor and thus RF power. This may be used to allow the power amplifier output power to be independent of power supply (for instance a battery voltage) until the power supply or more specifically the supply voltage falls below a set brown out level. As explained later on, a further advantage is that temperature stability of the amplifier may be tied to bandgap voltage stability.

According to a second aspect of the invention, there is provided a method of operating a programmable power amplifier comprising:
  a power amplifier core transistor circuit connected to a power amplifier output node;
  a switch connected to the power amplifier core transistor circuit, the switch being configured to switch on and off the power amplifier core transistor circuit;
  a feedback circuit of the power amplifier core transistor circuit, the feedback circuit comprising a digital-to-analog converter and an operational amplifier having a first input node configured to receive a first reference signal; a second input node connected to the digital-to-analog converter; and an output node for outputting an operational amplifier output signal and connected to the power amplifier core transistor circuit for controlling the amount of current flowing in the power amplifier core transistor circuit,
  wherein the digital-to-analog converter has a programmable resistance value and wherein the method comprises controlling the resistance of the digital-to-analog converter to thereby adjust a digital-to-analog converter output signal fed to the second input node of the operational amplifier for controlling a power amplifier output signal at the power amplifier output node.

Other aspects of the invention are recited in the dependent claims attached hereto.

BRIEF DESCRIPTION OF THE DRAWINGS

Other features and advantages of the invention will become apparent from the following description of a non-limiting example embodiment, with reference to the appended drawings, in which.

DETAILED DESCRIPTION OF THE INVENTION

Figure 1:
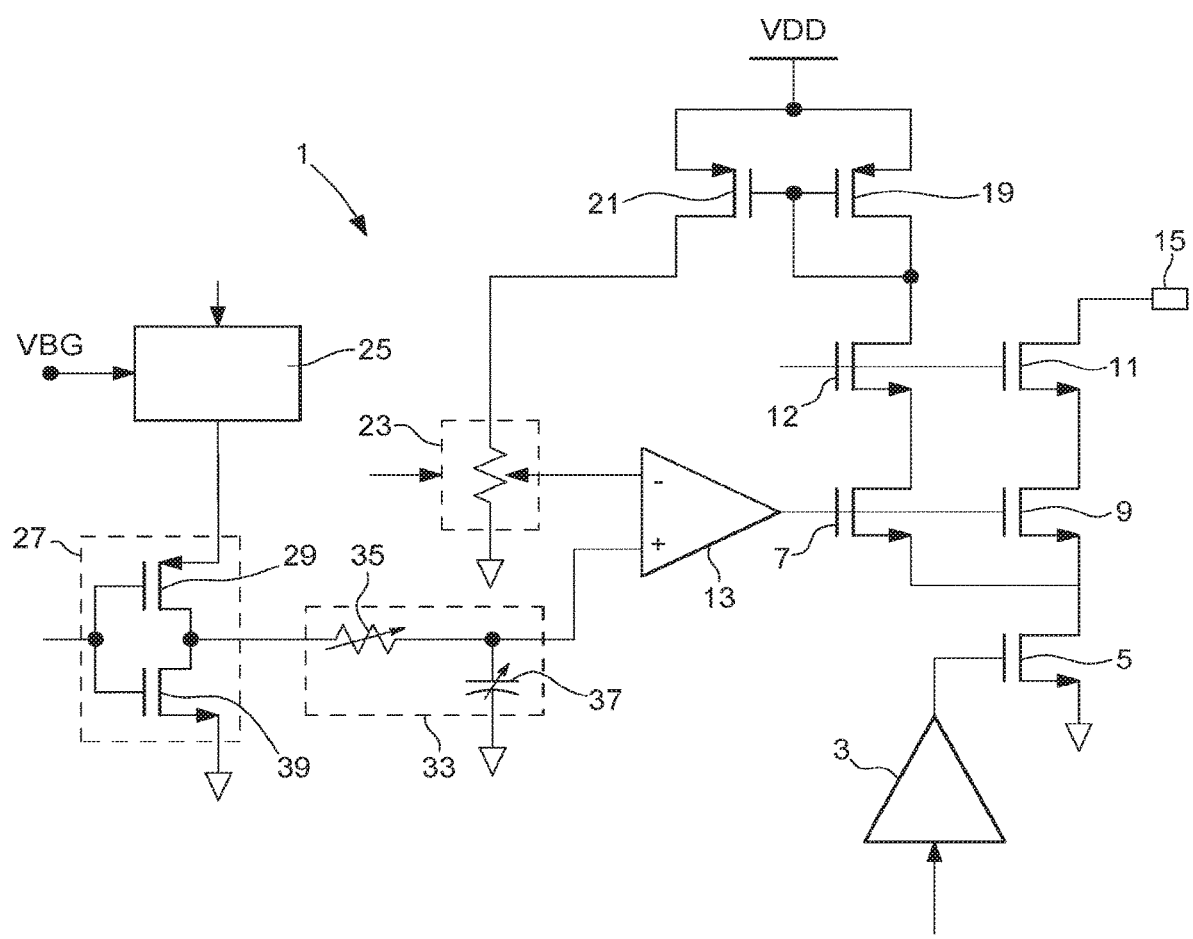
FIG. 1 shows a simplified circuit diagram illustrating the power amplifier according to an example embodiment of the present invention.

An embodiment of the present invention will now be described in detail with reference to the attached figures. The invention will be described in the context of a programmable precision power-controlled RF amplifier, also referred to simply as a power amplifier. However, the teachings of the invention are not limited to this environment or application.

Identical or corresponding functional and structural elements which appear in different drawings are assigned the same reference numerals. As utilized herein, "and/or" means any one or more of the items in the list joined by "and/or". As an example, "x and/or y" means any element of the three-element set {(x), (y), (x,y)}. In other words, "x and/or y" means "one or both of x and y." As another example, "x, y, and/or z" means any element of the seven-element set {(x), (y), (z), (x,y), (x,z), (y,z), (x,y,z)}. In other words, "x, y and/or z" means "one or more of x, y, and z." Furthermore, the term "comprise" is used herein as an open-ended term. This means that the object encompasses all the elements listed, but may also include additional, unnamed elements. Thus, the word "comprise" is interpreted by the broader meaning "include", "contain" or "comprehend".

FIG. 1 illustrates schematically the circuit or block diagram of the power amplifier 1. A preamplifier 3 is arranged to receive at its input an RF signal from an oscillator, which is not illustrated in FIG. 1. In this example, the RF signal has a frequency of 915 MHz. However, other frequencies are equally possible. Thus, in the present example the RF signal is an ultra high frequency (UHF) band signal. The UHF can be defined to be in the range between 300 MHz and 3 GHz. The preamplifier 3 is configured to amplify the RF signal received from the oscillator before the RF signal is fed to a switch 5. In this example, the switch is a first transistor and more specifically an n-type metal-oxide-semiconductor field effect transistors (MOSFET). As shown in FIG. 1, the gate terminal or node of the switch is connected to the output node of the preamplifier 3, while the source terminal is grounded. It is to be noted that in the present description when a node is grounded, it could instead be connected to a node having a fixed electrical potential. The drain terminal of the switch 5 is connected to a main amplifier stage, also referred to as a power amplifier core transistor circuit. The preamplifier is thus arranged to control the gate voltage of the first transistor to adjust the conductivity of the channel between source and drain nodes. In this manner, the switch 5 is arranged to be either closed or open. In the present description, when a switch or transistor is said to be closed, then the path between the source and drain nodes is electrically conductive, whereas when a switch is said to be open, then this path is not electrically conductive.

In this example, the main amplifier stage comprises a second transistor 7, a third transistor 9, a fourth transistor 11 and a fifth transistor 12. According to this example, all these four transistors are n-type MOSFETs. The third and fourth transistors are arranged in a series configuration and form an output branch of the power amplifier core transistor circuit. The output branch may comprise a given number of third and fourth transistors such that the sub branches (consisting of one third transistor and one fourth transistor) are arranged in a parallel configuration. The number of output sub branches may for instance be between 1 and 100 or more specifically between 20 and 60 or between 40 and 50. The second and fifth transistors 7, 12 are also arranged in a series configuration and form a feedback branch of the power amplifier core transistor circuit such that the feedback branch and the output branch are arranged in a parallel configuration.

As shown in FIG. 1, the source terminals of the second and third transistors are connected to the drain terminal of the first transistor 5. The gate terminals of the second and third transistors are arranged to be controlled by the output signal of an operational amplifier 13. The source terminal of the fourth transistor 11 is connected to the drain terminal of the third transistor 9, while the drain terminal of the fourth transistor is connected to an output node 15 of the power amplifier 1. The source terminal of the fifth transistor 12 is connected to the drain terminal of the second transistor. The gate terminals of the fourth and fifth transistors or more specifically their gate voltage levels are arranged to be controlled by a cascode bias signal. In the present example, the second and third transistors 7, 9 are substantially identical, while the fourth and fifth transistors 11, 12 are substantially identical. In the conductive states of the transistors, substantially less current is arranged to flow through the second and fifth transistors 7, 12 than through the power amplifier output branch leading to the power amplifier output node 15.

The fifth transistor 12 forms together with the fourth transistor 11 a cascode unit or a set of cascode transistors to protect the second and third transistors 7, 9 from excessively high voltage values and to minimize current errors in second and third transistors 7, 9 due to differences in drain voltages between second and third transistors 7, 9. As shown in FIG. 1, the drain terminal of the fifth transistor 12 is connected to a current mirror comprising a sixth transistor 19 and a seventh transistor 21, which in this example are both p-type MOSFETs. The current mirror is connected to the fifth transistor such that the drain node of the sixth transistor is connected to the drain terminal of the fifth transistor. As shown in FIG. 1, the current mirror is connected to a power supply, i.e. to a voltage supply VDD, which in this example is provided by a battery. The drain terminal of the seventh transistor 21 is connected to a digital-to-analog converter (DAC) 23, which has an adjustable or programmable resistance. The resistance can be adjusted with a first control signal (digital control signal), referred to as a tx_power in FIGS. 2 and 3, which may for instance be a binary word received at one of the input nodes of the DAC 23. One of the terminals of the DAC 23 is grounded as shown in FIG. 1, while one of the terminals (more specifically the output terminal) is connected to a negative input terminal of the operational amplifier 13. A positive input terminal of the operational amplifier is arranged to receive a reference signal or voltage or more specifically a scaled reference signal as explained later in more detail.

The power amplifier 1 further comprises a scaler 25 or scaling unit, which in this example is a digital-to-analog converter. As shown in FIG. 1, the scaler 25 has three nodes or terminals. One of these nodes is configured to receive a second control signal (digital control signal) or trimming signal for trimming the power amplifier offsets, which are due to manufacturing imperfections. One of the nodes is connected to a reference voltage node VBG for supplying a reference voltage Vbg referred to as a bandgap voltage. The scaler is configured to scale the reference voltage for instance by dividing it by a given value, which in this example is two. The output of the scaler is connected to an inverter 27. In this example, the output voltage value thus substantially equals Vbg/2. As shown in FIG. 1, the inverter comprises two transistors, namely an eighth transistor 29 and a ninth transistor 39. In this example, the output voltage value thus substantially equals Vbg/2. As shown in FIG. 1, the inverter comprises two transistors, namely an eighth transistor 29 and a ninth transistor 39. In this example, the eighth transistor is a p-type MOSFET, whereas the ninth transistor is an n-type MOSFET. As shown in FIG. 1, the source terminal of the eighth transistor 29 is connected to the scaler 25, while the source terminal of the ninth transistor 39 is grounded. The drain terminals of the eighth and ninth transistors are connected to each other. The gate terminals of the eighth and ninth transistors 29, 39 are configured to receive a modulation signal, which is a digital voltage signal. Thus, when the modulation signal is a logical high, then the inverter output is a logical low or vice versa. More specifically, when the modulation signal equals zero, then the inverter output signal substantially equals Vbg/2.

The inverter output is connected to a low pass filter 33, which in this example is a selectable bandwidth RC modulation filter comprising a resistor 35 and more specifically a variable resistor and a capacitor 37 and more specifically a variable capacitor. Thus, the resistance of the resistor 35 can be varied, while the capacitance of the capacitor 37 can be varied. In this manner the rise and fall times of the envelope of the modulated RF signal can be adjusted. In other words, the envelope shape of the modulated RF signal can be controlled. The output of the low pass filter is connected to the positive input terminal of the operational amplifier 13 to feed the scaled reference signal to the operational amplifier.

The operation of the power amplifier is explained next in more detail. The present invention deals with the entire on/off keying (OOK) of the power amplifier including the method for injecting the RF carrier, the feedback loop to control the RF output power, the DAC to program the RF output power, and the filtering to control the rise and fall times of the RF carrier.

The power amplifier 1 is a current output device. This means that current is delivered to an external block to generate the RF power via an open drain structure (the drain terminal of the fourth transistor 11 being connected to the amplifier floating output node 15). By attaching the output of the amplifier to an inductor that is also connected to the VDD and to an RF matching network, the current output from the amplifier generates a voltage across the inductor and thus RF power. This may be used to allow the amplifier output power to be independent of the VDD (in this case the battery) until the voltage provided by the VDD falls below a set brown out level. Thus, as long as the voltage provided by the VDD is above the brown out level, the amplifier functions properly, i.e. as described below.

One feature of the present invention is how the RF carrier is introduced to the power amplifier 1. Looking at the block diagram of FIG. 1, the first transistor 5 is used as a switching device where the gate is driven by the RF signal (in the present example 915 MHz). The advantages of this are twofold. First, if the RF level (i.e. the voltage level at the output of the preamplifier 3) is sufficient, the output power is not greatly affected by changes in the oscillator amplitude since the first transistor 5 acts as a switch. However, for lower voltages on the gate, the switch impedance changes rapidly and the output power is affected. Secondly, this allows for an easy way to trim and test the output. If the gate of the first transistor 5 is pulled high during test and trimming, then the power amplifier output is just direct current (DC) or a baseband signal that replicates the modulation applied to the inverter input. It is to be noted that there will be a conversion factor between the amplifier output current when a DC level is applied to the gate of the first transistor 5 versus when an RF signal is applied. For example, if the RF signal is a sinusoid, with 180 degrees of the signal above the threshold voltage Vt of the first transistor 5, the conversion factor is a root mean square (RMS) to DC conversion. Finally, since the RF turns on and off the first transistor 5 hard (hard on or off) the efficiency of the power amplifier is high (this statement only applies with the voltage since at the output, the voltage is around twice the voltage provided by the VDD). The proposed design can be made for example Class B or Class C depending on the on to off time ratio of the first transistor 5.

In the present embodiment, the actual power control loop of the power amplifier transistor circuit may be considered to consist of the second and fifth transistors 7, 12 (forming the feedback branch of the power amplifier core transistor circuit), the current mirror 19, 21, the DAC 23, the operational amplifier 13 and the modulation signal applied to the positive terminal of the operational amplifier. The loop operates as follows: the operational amplifier 13 drives the gates of the second and third transistors 7, 9 until the voltages at the positive and negative input terminals of the operational amplifier are equal. After this the output current of the operational amplifier becomes zero. This means that the gate voltages of the second and third transistors 7, 9 remain constant until there is voltage difference between the positive and negative input terminals of the operational amplifier. It is to be noted that the output current of the operational amplifier 13 equals the voltage difference between the positive and negative terminals multiplied by the power amplifier gain. The power amplifier output current is converted to a voltage by the gate capacitors of the second and third transistors 7, 9. The positive terminal voltage of the operational amplifier is the reference voltage and is used to trim the system to remove offsets and allow for precision power settings. The negative terminal voltage is generated by a variable feedback current into the resistive DAC. This current is a fractional version of the current that the power amplifier outputs to the RF load. It is to be noted that inherent parasitics filter this current so that only the baseband signal is fed back to the DAC 23 as the RF carrier is filtered out. The amount of current that is fed back is proportional to the current in the load and thus stabilizes the load power. Additionally, the feedback current is converted to a voltage via the DAC 23 and by adjusting the DAC resistance, the voltage generated versus current can be programmed and this is how (after trimming for absolute power via the scaler connected to the reference voltage supply VBG) the output power is determined. The feedback loop thus tries to make the negative input voltage of the operational amplifier equal to the positive input terminal.

For power steps in dB, the DAC 23 is not linear and uses a lookup table to control the final resistance value. The power amplifier 1 can be trimmed at the factory by adjusting the trimming signal to remove offsets and ensure repeatability from device to device. This scales the amplifier's bandgap voltage Vbg from the reference voltage supply VBG and is used as the reference voltage for the feedback loop. Modulation is then applied as a signal between ground and the trimmed bandgap voltage (nominally Vbg divided by 2). Since the bandgap is stable versus temperature all currents are stabilized via the feedback loop.

A further aspect of the proposed power amplifier is that the modulation rise and fall times can be adjusted by the low pass filter 33 to control the shape of the RF envelope during turn on and turn off. This allows for changing the output spectrum and can be used to meet governmental and system spectral mask requirements. Since the shaping is done outside the loop, the loop operation linearizes this and applies the shape to the output current of the power amplifier. It should be noted that since the output power is proportional to current squared, the wave shaping characteristics are squared in the power domain.

Figure 2:
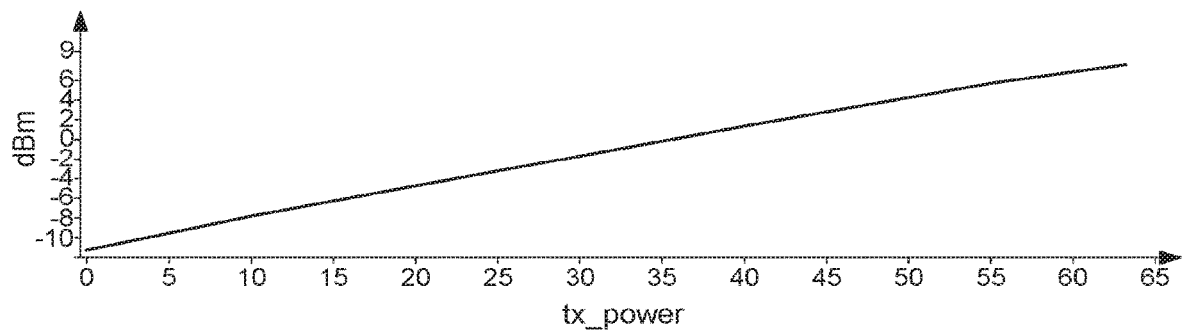
FIG. 2 is a diagram showing the output power of the power amplifier of FIG. 1 as a function of a control signal value.
Figure 3:
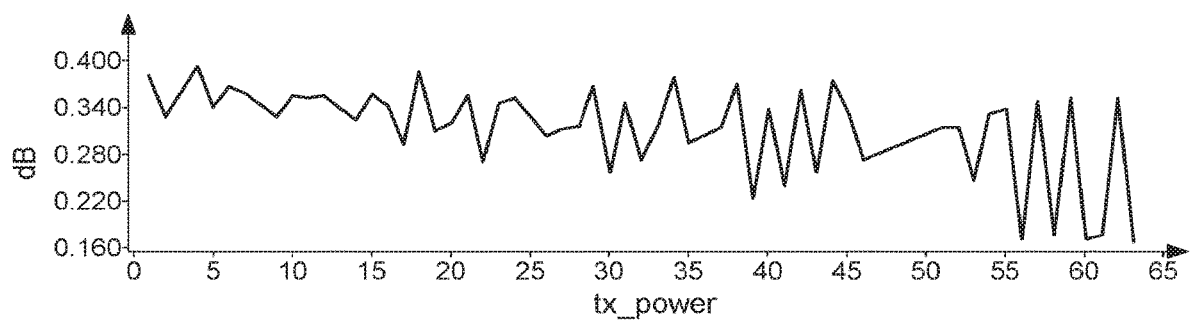
FIG. 3 is a diagram showing the derivative of the output power curve of FIG. 2.
Figure 4:
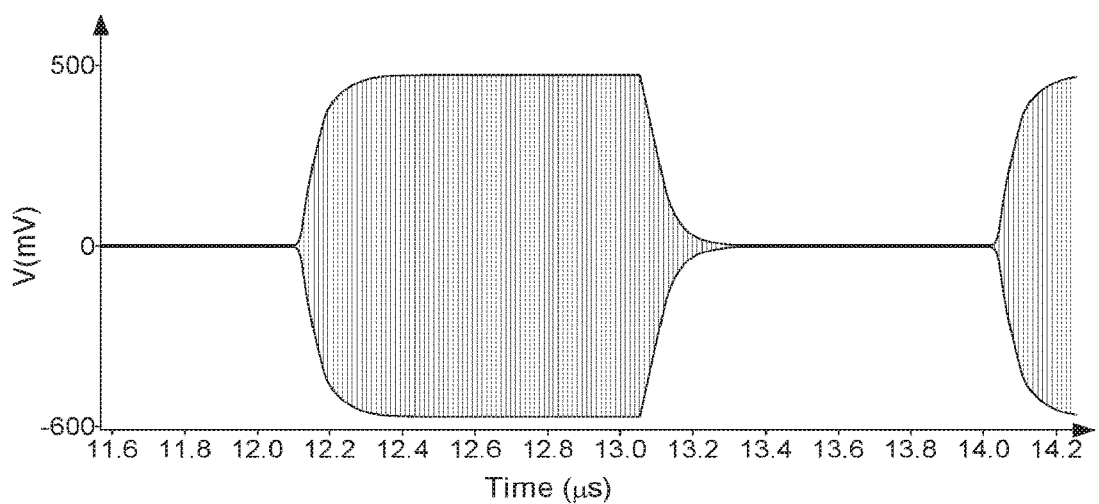
FIG. 4 is a diagram showing the modulated RF signal as measured at an output node of the power amplifier of FIG. 1.

FIGS. 2 to 4 show some simulation plots illustrating the operation of the power amplifier 1. FIG. 2 shows a graph illustrating the output power of the power amplifier 1. It can be shown how the output power increases substantially linearly as a function of the first control signal. The graph in FIG. 3 shows the slope of the graph of FIG. 2, in other words the derivative of the curve of FIG. 2. FIG. 4 shows the modulated RF signal as a function of time. As can be seen, the rise and fall times of the signal envelope are not instantaneous and the duration of the rise and/or fall times can be controlled by the low pass filter 33.

While the invention has been illustrated and described in detail in the drawings and foregoing description, such illustration and description are to be considered illustrative or exemplary and not restrictive, the invention being not limited to the disclosed embodiment. Other embodiments and variants are understood, and can be achieved by those skilled in the art when carrying out the claimed invention, based on a study of the drawings, the disclosure and the appended claims.

In the claims, the word "comprising" does not exclude other elements or steps, and the indefinite article "a" or "an" does not exclude a plurality. The mere fact that different features are recited in mutually different dependent claims does not indicate that a combination of these features cannot be advantageously used.

What is claimed is:

1. A programmable power amplifier comprising:
   a power amplifier core transistor circuit connected to a power amplifier output node;
   a switch connected to the amplifier core transistor circuit, the switch being configured to switch on and off the amplifier core transistor circuit;
   a feedback circuit connected to the power amplifier core transistor circuit, the feedback circuit comprising a digital-to-analog converter and an operational amplifier having a first input node configured to receive a first reference signal; a second input node connected to the digital-to-analog converter; and an output node for outputting an operational amplifier output signal and connected to the amplifier core transistor circuit for controlling the amount of current flowing in the amplifier core transistor circuit,
   wherein the digital-to-analog converter has a programmable resistance value for controlling the resistance of the digital-to-analog converter to thereby adjust a digital-to-analog converter output signal configured to be fed to the second input node of the operational amplifier for controlling a power amplifier output signal at the power amplifier output node.

2. The programmable power amplifier according to claim 1, wherein the switch comprises a first transistor connected between the power amplifier core transistor circuit and a reference node at a fixed electrical potential, the operation of the first transistor being configured to be controlled by an RF signal.

3. The programmable power amplifier according to claim 2, wherein the first transistor is an n-type metal-oxide-semiconductor field effect transistor.

4. The programmable power amplifier according to claim 1, wherein the power amplifier core transistor circuit comprises a second and third transistors connected to the switch and a fourth transistor connected to the power amplifier output node, the amount of current flowing in the second and third transistors being configured to be controlled by the operational amplifier output signal.

5. The programmable power amplifier according to claim 4, wherein the second, third and fourth transistors are n-type metal-oxide-semiconductor field effect transistors.

6. The programmable power amplifier according to claim 4, wherein the power amplifier core transistor circuit further comprises a fifth transistor forming together with the fourth transistor a cascode circuit for protecting the second and third transistors from excess voltage values, the fourth and fifth transistors being configured to be controlled by a cascode bias signal.

7. The programmable power amplifier according to claim 1, wherein the feedback circuit further comprises a current mirror connected between the digital-to-analog converter and the power amplifier core transistor circuit.

8. The programmable power amplifier according to claim 7, wherein the current mirror comprises a sixth and seventh transistors, wherein the sixth and seventh transistors are p-type metal-oxide-semiconductor field effect transistors.

9. The programmable power amplifier according to claim 7, wherein the feedback circuit is connected to a voltage supply.

10. The programmable power amplifier according to claim 1, wherein the digital-to-analog converter is configured to convert an input current to a voltage.

11. The programmable power amplifier according to claim 1, wherein the resistance value of the digital-to-analog converter is configured to be controlled by a first digital control signal.

12. The programmable power amplifier according to claim 1, wherein the power amplifier further comprises a scaler for scaling a second reference signal, wherein the first reference signal receives the scaled second reference signal.

13. The programmable power amplifier according to claim 12, wherein the operation of the scaler is arranged to be controlled by a second digital control signal.

14. The programmable power amplifier according to claim 12, wherein the programmable power amplifier further comprises an inverter for receiving a scaler output signal and a modulation signal.

15. The programmable power amplifier according to claim 1, wherein the programmable power amplifier further comprises a low pass filter for adjusting rise and/or falls times of an envelope of the programmable power amplifier output signal.

16. The programmable power amplifier according to claim 15, wherein the low pass filter is connected to the first input node of the operational amplifier.

17. The programmable power amplifier according to claim 15, wherein the low pass filter comprises a variable resistor and a variable capacitor.

18. The programmable power amplifier according to claim 1, wherein the power amplifier core transistor circuit comprises a set of third and fourth transistors forming an output branch of the power amplifier core transistor circuit, wherein the number of third and fourth transistors in the set is between 20 and 100.

19. A method of operating a programmable power amplifier comprising:
   a power amplifier core transistor circuit connected to a power amplifier output node;
   a switch connected to the power amplifier core transistor circuit, the switch being configured to switch on and off the power amplifier core transistor circuit;
   a feedback circuit Roll connected to the power amplifier core transistor circuit, the feedback circuit comprising a digital-to-analog converter and an operational amplifier having a first input node configured to receive a first reference signal; a second input node connected to the digital-to-analog converter; and an output node for outputting an operational amplifier output signal and connected to the power amplifier core transistor circuit for controlling the amount of current flowing in the power amplifier core transistor circuit, wherein the digital-to-analog converter has a programmable resistance value and wherein the method comprises controlling the resistance of the digital-to-analog converter to thereby adjust a digital-to-analog converter output signal fed to the second input node of the operational amplifier for controlling a power amplifier output signal at the power amplifier output node.

\* \* \* \* \*